United States Patent
Roth et al.

[11] Patent Number: 5,319,333
[45] Date of Patent: Jun. 7, 1994

[54] SUPERCONDUCTING HOMOGENEOUS HIGH FIELD MAGNETIC COIL

[75] Inventors: Gerhard Roth, Karlsruhe, Fed. Rep. of Germany; Werner Tschopp, Aesch, Switzerland

[73] Assignee: Bruker Analytische Messtechnik GmbH, Fed. Rep. of Germany

[21] Appl. No.: 807,836
[22] PCT Filed: Jul. 10, 1990
[86] PCT No.: PCT/DE90/00517
§ 371 Date: Mar. 9, 1992
§ 102(e) Date: Mar. 9, 1992
[87] PCT Pub. No.: WO91/01564
PCT Pub. Date: Feb. 7, 1991

[30] Foreign Application Priority Data

Jul. 15, 1989 [DE] Fed. Rep. of Germany ....... 3923456

[51] Int. Cl.$^5$ ............ H01F 5/00; H01F 1/00
[52] U.S. Cl. ........................ 335/216; 335/299
[58] Field of Search ............ 335/213, 216, 299; 324/318, 319, 320; 505/844

[56] References Cited

U.S. PATENT DOCUMENTS

| | | | |
|---|---|---|---|
| 2,159,534 | 5/1939 | Ruska | 335/213 |
| 3,177,408 | 4/1965 | Mills et al. | 335/216 |
| 3,559,130 | 1/1971 | Schraeder | 335/216 |
| 4,682,134 | 7/1987 | Laskaris | 335/216 |
| 4,694,269 | 9/1987 | Burnett et al. | 335/216 |

FOREIGN PATENT DOCUMENTS

| | | | |
|---|---|---|---|
| 2045978 | 9/1970 | Fed. Rep. of Germany | H01F 5/02 |
| 3531322 | 2/1985 | Fed. Rep. of Germany | H01F 5/08 |
| 1209196 | 2/1960 | France | |
| 1404437 | 2/1965 | France | |
| 1511677 | 2/1968 | France | |
| 55-160405 | 12/1980 | Japan | H01F 5/08 |
| 60-53003 | 3/1985 | Japan | H01F 5/08 |
| 61-65407 | 4/1986 | Japan | H01F 5/08 |
| 61-65411 | 4/1986 | Japan | H01F 7/22 |
| 0082404 | 4/1986 | Japan | 335/216 |
| 62-109303 | 5/1987 | Japan | H01F 5/08 |
| 62-285405 | 12/1987 | Japan | H01F 5/08 |

OTHER PUBLICATIONS

Journal of Physics E, Scientific Instruments, 1972, pp. 944–946, Cesnak et al.: A cylindrical coil with graduated current density for very homogeneous magnetic fields.

IEEE Transactions on Magnetics, vol. 23, No. 2, Mar. 1987, New York US, pp. 565–568 M. Takeo et al.: A 17 tesla superconducting magnet with multifilamentary superconductors.

IEEE Transactions on Magnetics, vol. 24, No. 2, Mar. 1988, New York US, pp. 1409–1412, P. A. Jonas et al.: 12 tesla superconducting multifilamentary magnet.

*Primary Examiner*—Leo P. Picard
*Assistant Examiner*—Raymond Barrera
*Attorney, Agent, or Firm*—Walter A. Hackler

[57] ABSTRACT

The invention concerns a superconducting high field magnetic coil for the production of magnetic field with one or more approximately rotationally symmetric hollow cylindrically shaped winding regions made from layers of windings of a superconducting wire through which current is flowing whereby in axial end regions of at least one winding region, radial components of the magnetic field are present which lead to axial Lorentz forces as well as to the accumulation of axial pressures in the winding layers. According to the invention, in the axial end regions of at least one winding region, the current density in at least one winding layer (S3, S4) is reduced relative to the normal current density present in the region bordering on the end region so that, thereby, the maximum Lorentz force occurring in these winding layers as well as the maximum occurring axial pressure is maintained within permissible limits.

3 Claims, 3 Drawing Sheets

SUPERCONDUCTING HOMOGENEOUS HIGH FIELD MAGNETIC COIL

The invention concerns a superconducting homogeneous high-field magnetic coil which is utilized for the production of a static magnetic field in combination with a nuclear magnetic resonance spectrometer.

The invention is based upon a multi-layer coil which is known in the art from the Journal of Physics E. Scientific Instruments, 1972, Pages 944 through 946. In the coil which is known in the art the current density in the middle lengthwise region is reduced through the addition of a passive wire winding in order to produce a homogeneous magnetic field.

Known in the art from patent abstracts of Japan Vol. 10 No. 233 (J-P-A. 6 165 4 11) is the reduction of the average current density in the end regions through the addition of a passively wound wires. This publication discloses, however, a one layer coil and the purpose lies in the limitation of the local increase of the magnetic fields in the end portion of the coil in order to prevent the critical field strength of the superconductor from being exceeded. There is no suggestion that this configuration should be utilized in order to reduce the pressure within the coil produced in consequence of the Lorentz forces. The problem of the field increase with extremely thin one-layer solenoid coils is treated, a problem which in principle does not occur in multi-layered coils. The accumulated pressure is, in this case, no problem. On the other hand, in multi-layer high field magnet coils which are the object of the invention, the field strength in and of itself is non-critical.

In order to produce magnetic fields of high magnetic field strength (many Tesla), among others, superconducting magnet coils are utilized which are constructed from winding layers of a superconductable wire and exhibit approximately rotationally symmetric hollow cylinder shaped winding cross sections. In order to realize the superconducting capability of the wire material, by way of example $Nb_3Sn$ with copper stabilization, at the necessary current strengths and magnetic field obtaining in the vicinity of the wire, the magnetic coils operate within cryostats which, in the example mentioned, can be cooled by means of liquid helium to a temperature of 4.2 K. In addition to the superconducting type A15 which is suitable for the highest fields and to which $Nb_3Sn$ belongs, most recently, other superconducting materials have become known in the art with which a utilization in a magnet construction well above 4.2 K, possibly at the temperature of liquid nitrogen, appear to be possible in the near future.

Due to the radial component of the magnetic fields produced by means of the magnet coil, axial pressures due to Lorentz forces occur in the windings. The axial Lorentz forces increase with increasing radial component of the magnetic field, that is to say, they are largest in the region of the two coil ends. The resulting axial pressures, thereby accumulate towards the coils' center, so that the maximum axial pressure occurs in the coil center. These pressures, with high field magnets, obtain a value on the order of 50 Megapascals at the center of the coil (P. Turowski et al., 9th International Conference on Magnet Technology, p. 394, 1985) and can, when charging up the magnet, in particular in places in which the winding is not homogeneous, cause movement of the conductors which, in consequence of the heat generated by said movement, can cause a transition of the wire into the normally conducting state. Since the normally conducting region, despite low resistance copper stabilization, in consequence of the electrical resistance, continues to heat up the entire magnet coil quickly becomes normally conducting.

To produce the highest magnetic fields, the high field magnet coils known in the art are also operated at 1.8 K in order to achieve a higher current carrying capability of the conductors (see by way of example P. Turowski, Th. Schneider in 2nd High Field Conference Leuven 1988).

Superconducting high field magnetic coils which are utilized for the production of very homogeneous magnetic fields in the inside of the hollow cylinder, have, in contrast to inhomogeneous magnets, a larger coil length and are equipped with additional coils which compensate for those magnetic field components of the high field magnet coils which most strongly determine the dependence of the magnetic field strength on the axial position. Such additional coils are often introduced completely outside of the magnet and usually, in fact, are wound on a separate coil body (see for example J. E. C. Williams et al., IEEE Transactions on Magnetics, Vol 25, p. 1767). These additional magnet coils can, however, also be realized in that regions are introduced in the windings themselves in which the current density is reduced with respect to that in the surrounding winding regions (see here by way of example L. Cesnak and D. Kabat, Journal of Physics E. Scientific Instruments 944, 1972). Such a region has the effect of a additional coil of negative current density. This method of homogenizing has the advantage that the additional coil does not directly require additional construction room and that the homogenizing region is easily introduced more radially inward in the coil, as a result of which its effectivity is increased. The field region which is to be homogenized is located, thereby, at the coil center since the magnetic field here runs axially and the dependence of the magnetic field strength on the axial length is minimum. Thereby the regions of reduced current strength for the homogenization of the magnetic field are also arranged in the coil center.

Superconducting high field magnets for the production of a very homogeneous magnetic field of the kind mentioned, as by way of example used in NMR spectroscopy, have accordingly, on the one hand, the disadvantage that due to the larger necessary coil length the maximum axial pressure is particularly large (the axial pressure accumulates namely in each winding layer over the individual windings from the coil ends towards the coil middle so that its magnitude increases with the coil length) and, on the other hand, the disadvantage that through the introduction of the region of reduced current density, border surfaces result between the regions of normal current density and the homogenizing regions of reduced or vanishing current density. The allowable axial pressures on these border surfaces are substantially less than in homogeneous layers of the winding. In consequence the achievable magnetic field strength in the superconducting magnet coils for the production of homogeneous magnetic fields is less than of non-homogenized magnetic coils. The magnetic field strengths which are achievable in superconducting high-field magnets known in the art with homogenized magnetic fields lying in the region of 14 Tesla whereas with non-homogenized magnetic coils, magnetic field strengths up to 20 Tesla are achievable. In a homogenized magnet for use in an NMR spectrometer, the basic homogeneity is typically good enough so that a homogeneity of $\Delta B/B_0 < 10$ ppm and, in combination with a superconducting shim system, a homogeneity of $\Delta B/B_0 < 1$ ppm is achieved over an axial region of length $> 30$ mm. The magnetic field strengths which are currently achieved in NMR spectroscopy with this type of magnet vary with the coil type. Thereby, in a "standard bore" high field magnet with a room temperature bore of 51.5 mm diameter, the present maximum achievable magnetic field strength is 14.1 T. In a "wide bore" magnet with 89 mm room temperature bore, this value falls to 11.7 T, and in a "super wide bore" magnet with 150 mm diameter room temperature bore, to 7 T. Depending on the construction type, such high field magnets are associated with varying expectations for the maximum achievable field range.

SUMMARY OF THE INVENTION

It is intended, in the context of the present application that the term "through which current is flowing only in series", is meant to clearly state that the superconducting wire, which is composed of a superconductable material and a normally conducting material never exhibits branches. The existence of branches result in an undefined current path so that coils with this type of branching are not suitable for the production of homogeneous magnetic fields since into which of the respective available paths the entire current will flow into or from and in what ratio said current will distribute itself within the two paths is indefinite.

The underlying purpose of the invention is to, in magnets which are to be homogenized, so control the large forces which occur in consequence of the required increased construction lengths in such a way that a stable superconduction is effected in the coil. This control of the forces is achieved in that a redirection of the forces from the overstressed coil regions into lower stressed regions is effected. With homogeneous magnets, this introduces the possibility of achieving a larger field strength than that which has up to now been possible. On the other hand, the below mentioned method of force redistribution also offers the possibility of increasing the currently maximum controllable field strength of superconducting magnets which have not been homogenized. The stated force or pressure redistribution is to be understood in that the coil in accordance with the invention, compared to the coil known in the art, exhibits a pressure load which is lower in some portions of the coil and an increased pressure load in other portions of the coil. Clearly, the coil in accordance with the invention must be calculated thoroughly.

The superconducting high field magnetic coil in accordance with the invention with the features of the characterizing part of the main claim has the advantage that the axial pressure load in each of the initially overloaded winding layers can be reduced below the empirically determined allowable upper limit. The axial pressure load of the winding layer is given approximately by the sum over the contributions of the individual windings of this layer. The size of the contribution of each individual winding thereby depends on the current density in the conductor as well as on the radial magnetic field strength at the location of the winding.

With the invention the current density is reduced "in many winding layers". This implies that the superconducting wire exhibits a constant height (measured in the radial direction of the coil), and when utilizing a round wire, a constant diameter, since otherwise it would not be possible to produce a plurality of winding layers, whereby each of same must exhibit a uniform thickness.

Since the contributions to the accumulated axial pressure are largest in the border region of the coil in consequence of the larger radial component of the magnetic field present there, the configuration of the regions of reduced current density is particularly effective at the coil end regions. Towards this end it is not absolutely necessary that the regions of reduced current density extend to the end of the coil. The configuration of the regions of reduced current density in the coil middle, on the other hand, would result in no substantial reduction in the axial pressure load.

In the invention the expression "current density" is not to be interpreted as "current density in superconductable material" since a mere increase in the cross sectional area of the superconductable material at the expense of the cross sectional area of the copper would not lead to the desired goal of the invention. Rather "current density in at least one winding layer" refers to the average current density in a surface element of the winding cross section, which by way of example includes at least two wire cross sections (so that the additional passive wire winding which is present under certain circumstances is also included).

With the invention the current density in a location which is different from the one in the above mentioned reference, namely the end region of a coil winding, is reduced in many layers in such a way as to reduce the Lorentz forces acting upon the superconducting wire. The measures in accordance with the invention can be applied to partial windings which exhibit the normal current density in their middle region as by way of example is the case with the partial winding S4 of the embodiment. The invention can however also be applied in a particularly advantageous fashion to such partial windings with which as in the above mentioned reference, a reduced current density is present in the middle region which by way of example is produced through the addition of passive wire winding through which no current is flowing and which is particularly sensitive to an overly strong pressure.

With appropriate application of the superconducting high field magnet with a magnet coil in accordance with the invention it is possible to produce higher homogeneous magnetic fields than those which were up to now possible. This is possible in that, at the locations at which the allowable limit of the axial pressure load would have been exceeded, a local pressure reduction is carried out.

In general it turns out, through the introduction of regions of reduced current density in accordance with the invention, there is the possibility that the magnet winding can be specifically operated over a wide radial region at the allowable load for each radius, that is to say, overloaded winding layers can be relieved and underloaded layers loaded more heavily since the introduction of regions of reduced current density in winding layers leads to an increase in the axial pressure load in winding layers without such a region. This is true since the windings which are missing in the regions with reduced current density must be introduced into other locations.

In an advantageous embodiment of the invention, the regions of reduced current density are arranged symmetrically with respect to a plane which runs perpendicular to the lengthwise axis of the coil at the middle of the coil. As was already discussed above, the contribution of individual windings of a winding layer to the axial pressure load is the larger the closer the winding is to the end of the coil so that a reduction is the more effective the further outside it is arranged in the coil. A maximum reduction of the current density at the coil end to zero is equivalent to a reduction in length of the winding in the corresponding layer.

In an advantageous embodiment of the invention one or more additional regions of reduced current density are provided for in the vicinity of the coil middle. These homogenized regions of reduced current density in th coil middle are, when the pressure load there is initially larger than the allowable maximum value, load reduced through the introduction of regions of reduced current density in regions of the coil ends in the same radial location (namely position) and extension as in the homogenizing regions. This has the advantage that in the inside of the hollow cylinder surrounded by the magnet coil it is possible to produce a homogeneous magnetic field without the danger of destroying the superconductivity due to the reduced axial pressure loadability of the border surfaces between the homogenizing region and the more densely wound region.

In an advantageous embodiment of the invention, the transition in the radial direction from a region of reduced current density to a region of normal current density takes place in a stepwise fashion. In this manner one achieves the advantage that the substantial reduction of the axial pressure is tapered off in a stepwise fashion.

In a further advantageous embodiment of the invention the transition and the radial direction from a region of reduced current density to a region of normal current density takes place quasi-continuously with steps which are given by the wire thickness. This has likewise the advantage that the substantial reduction of the axial pressure is slowly tapered-off.

In further advantageous embodiments of the invention the stepwise or quasi-continuous transition in the radial direction between a region of reduced current density and a region of normal current density transpires through appropriate changes in the axial extension of the region of reduced current density and/or through an appropriate change in the contribution of the negative current density from winding layer to winding layer in the transition region.

Further features and advantages of the invention are manifested in the following description of an embodiment by means of the drawing which show particular details of importance to the invention as well as from the claims. The individual features can be used alone or collectively in arbitrary combination in an embodiment of the invention. Shown are:

DETAILED DESCRIPTION

Figure 1:
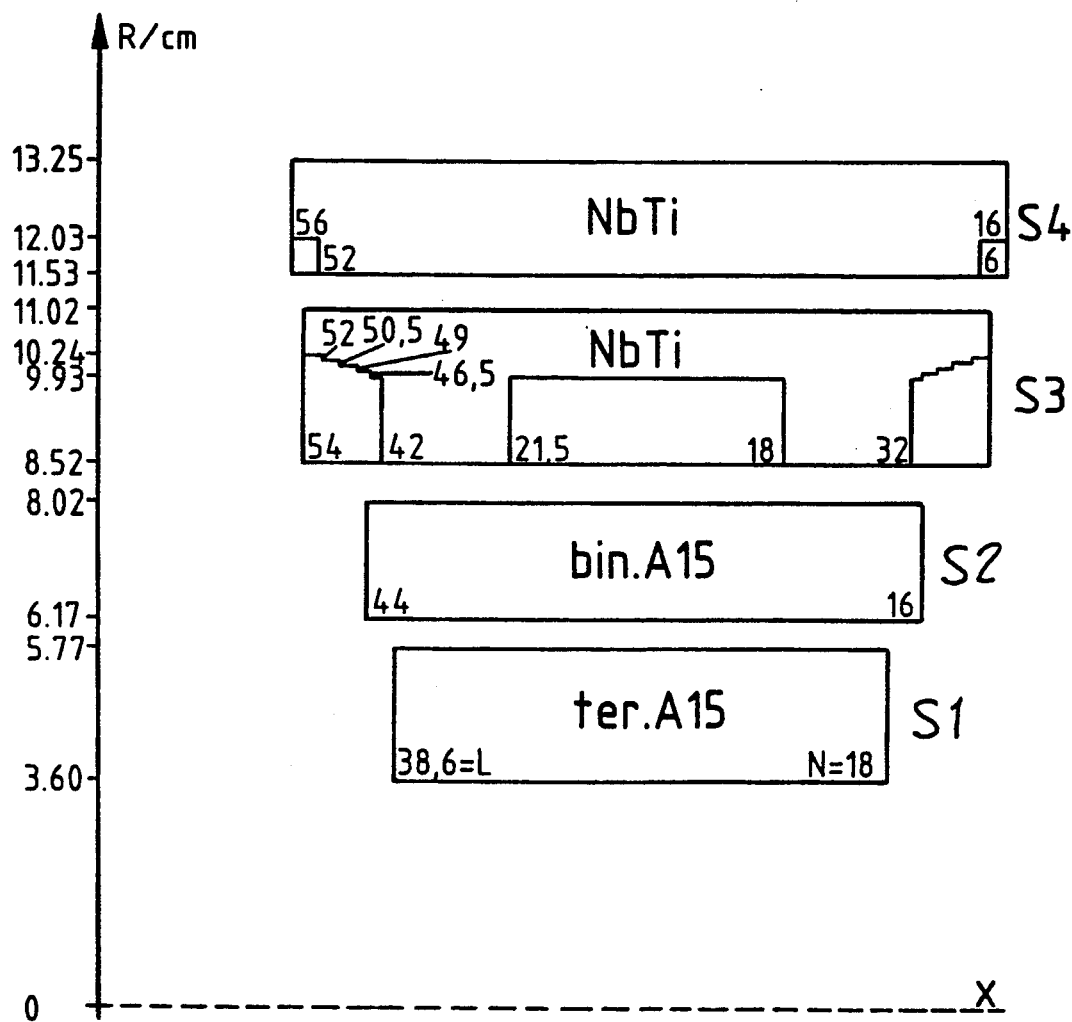
FIG. 1 a lengthwise cross section of a superconducting high field magnetic coil in accordance with the invention with four winding sections in an extremely schematic representation, FIG. 2 a graphical representation of the axial pressure load in this coil, FIGS. 3a and 3b two examples of the transition from normal current density to reduced current density.

The superconducting high field magnetic coil which is represented in an extremely simplified fashion in FIG. 1 consists of four winding sections of which only the respective cross sectional plane contours are shown. The coil shape is given by the rotation of the figure section about the rotational axis X which simultaneously corresponds to the lengthwise axis of the coil. A second axis is shown perpendicular to the axis X upon which the radial separation R from the lengthwise axis of the coil in centimeters is recorded. The four coil winding sections S1 to S4 are effected in differing fashions taking into consideration the superconducting capability of the material. While the two outermost winding sections S3 and S4 are constructed from windings with niob-titan-wire with stabilizing copper, the second innermost winding section S2 utilizes a binary A15 superconductor, and the innermost winding cross section S1 a tertiary A15 superconductor, each with a stabilizing copper core. The entire coil is realized in a fashion symmetric with respect to a plane which runs perpendicular to the lengthwise coil axis X at the middle of the coil. The radius of the hollow cylinder surrounded by the magnet coil assumes a value of ca. 3.6 cm. The innermost winding section S1 has an axial length of ca. 38.6 cm and a radial thickness of ca. 2.2 cm. The second innermost winding section S2 has a separation of approximately 0.4 cm with respect to the first winding cross section S1, an axial length of approximately 44 cm and a radial extent of ca. 1.8 cm. The second outermost winding S3 has a separation of 0.5 cm with respect to the second innermost winding S2, an axial length of ca. 54 cm, a radial thickness of ca. 2.5 cm, and exhibits 32 winding layers. A rectangular NbTi conductor with 54 filaments and 57.4% stabilizing copper is utilized, the dimensions of which are $0.78 \times 1.24$ mm$^2$. The outermost winding section S4 has a separation with respect to the second outermost S3 of 0.5 cm, an axial length of ca. 56 cm, a radial extension of about 1.7 cm and consists of 22 winding layers. A rectangular NbTi conductor with only 36 filaments and a copper portion increased to 80% is utilized. The dimensions are $0.78 \times 1.24$ mm$^2$. The innermost winding section S1 and the second innermost winding section S2 are homogeneously wound through. The second outermost winding cross section S3 exhibits a region symmetrically arranged about the middle axis of the coil with a current density reduced to 50% which starts in the first winding layer and extends through to the 18th winding layer and exhibits an axial extension of ca. 21.5 cm. This region of reduced current density serves to homogenize the magnet and causes the relative field change in an axial region of ±30 mm about the coil center to be smaller than 10 ppm. Likewise symmetric to the coil middle plane and also starting in the first winding layers, a further region of reduced current density is provided for in each of the two coil end regions which extends up to 22 winding layers. The axial extent of each of these two regions assumes a value from the first through to the 18th winding layer of ca. 6 cm and decreases from the 19th winding layer in a plurality of steps of varying length (lengths from 2.25 cm, 1.25 cm, 0.75 cm, 0.75 cm, 1 cm). (The numbers which are written on the left end region of the winding S3 refer to the sum of the corresponding length entries of both coil end regions).

The outermost winding section S4 exhibits for its part, in both of the coil end regions, two regions which are symmetric with respect to the middle plane of the coil which have 80% reduced current density and which extend through the layers 1 through 6. A step-down along the length for transition to the full winding length is not necessary here due to the only small change in the axial pressure.

The superconducting high field magnetic coil which is represented exhibits, at an operating current of 187.4 A an induction flux density of 14.1 Tesla and has an inductance of 43.8 Henry. The contained energy assumes a value of 770 kJ. The high field magnetic coil is operated in superconducting short circuit and has a field change (drift) versus time of less than $10^{-7}$ per hour. The axial homogeneity region of the magnet coil in which the induction flux density changes by less than 10 ppm, has a length $\geq 60$ mm and thereby satisfies the fundamental requirements usually given for magnets for utilization in NMR spectroscopy.

Figure 2:
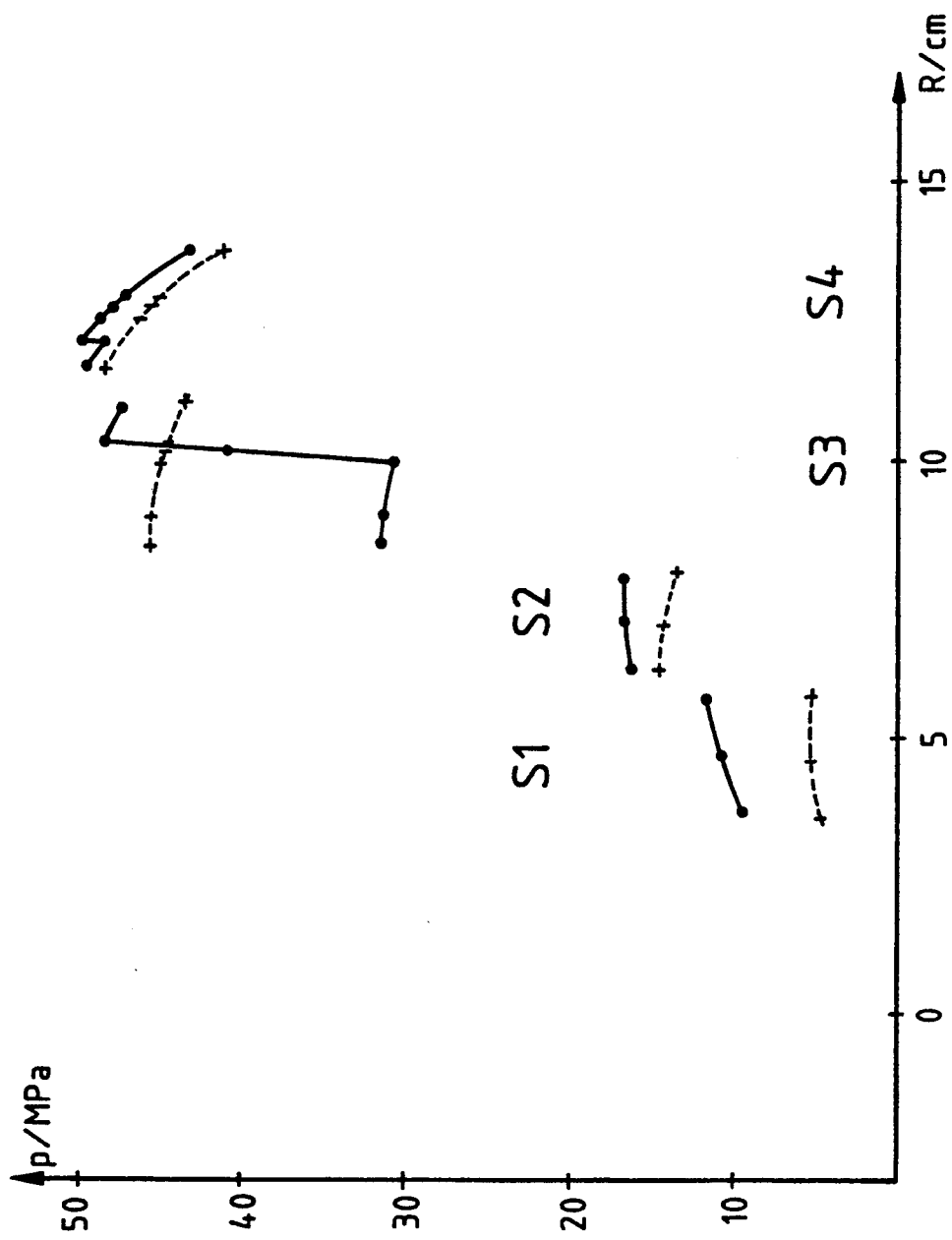

FIG. 2 shows a graphical representation of the axial pressure load p in the 4 winding sections, with the axial pressure load in Megapascals being plotted versus the winding layer characterizing coil radius R. In both of the inner winding sections, the axial pressure is still quite small. In contrast, the axial pressure load in both of the outer winding sections is quite high. Here it is only possible to introduce a region of reduced current density in the coil center if the axial pressure load in the relevant winding layers is reduced. This transpires in accordance with the invention with the additional introduction of regions of reduced current density in both of the coil end regions. These regions are extended in steps onto the neighbouring winding layers in order to stepwise taper-off the substantial reduction in the axial pressure. Furthermore, a reduction in the maximal occurring axial pressure is thereby achieved in this winding section. In the inner layers of the outermost winding section S4 axial pressure would initially exceed a value of 50 MPa. Through the introduction of the regions of reduced current density in the inner winding layers in the end region of the coil it is possible to reduce the maximum pressure load again to less than 50 MPa. In FIG. 2 the pressure load in the individual winding layers without compensating measures is represented as a dashed line whereas the solid line represents the pressure load after introduction of the compensating regions at the coil ends. One notices that not only the critical winding layers are load reduced but also that the pressure load in other uncritical winding layers is redistributed.

Figure 3A:
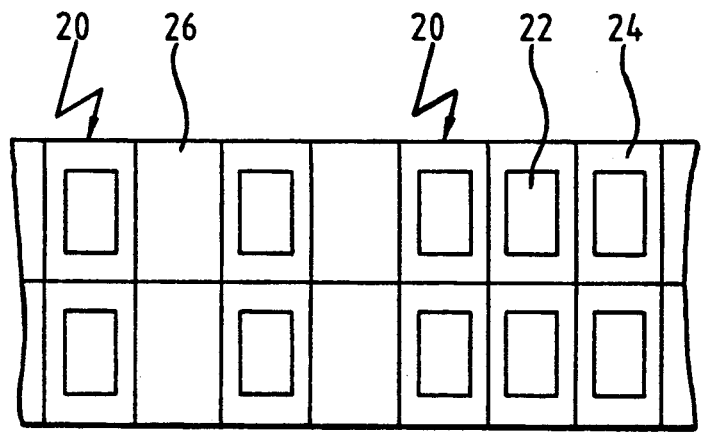

FIG. 3a shows a broken-off cross section of two layers of the winding S3 in the left transition region to a region of reduced current density. The superconductable wire 20 is rectangular wire with the above mentioned dimensions. The superconducting material 22 is surrounded by a jacket 24 of copper. In the right portion of FIG. 3a, the normal average current density occurs during operation. Only half as large a current density occurs in the left portion since a so-called blind wire 26 which, at least for superconducting operation of the configuration, has no current flowing through it, is wound in so that the separation from middle to middle between the individual windings of the wire 20 is doubled. The same configuration can be applied when utilizing round wire. The advantage of the configuration according to FIG. 3a is that the wire can be wound within each winding layer without any soldering joints.

Figure 3B:
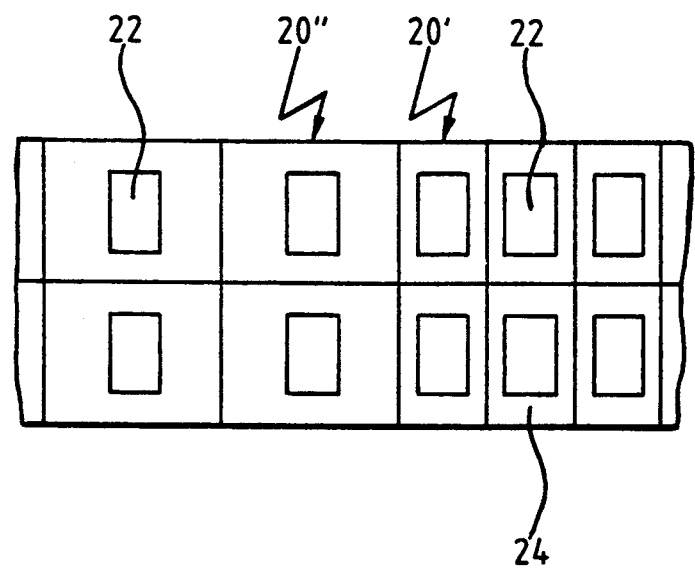

The right side of FIG. 3b corresponds with FIG. 3a. In the left part of this example, the superconducting wire 20' which here also contains copper and superconducting material goes over into a wire 20" which is twice as wide as the wire 20', whereby however the cross section of the superconducting material is equally large in the wires 20' and 20".

It is possible by way of example to utilize the following materials for the winding sections S1 and S2: superconducting materials NbTi and/or an A15 superconductor by way of example $Nb_3Sn$ and/or $Nb_3SnTa$ or $Nb_3SnTi$ and/or $YBa_2Cu_3O_x$ or $Bi_2Sr_2CaCu_2O_8$ or $Tl_2Ba_2CaCu_2O_8$ or $Tl_2Ba_2Ca_2Cu_3O_{10}$ or another oxide material combination can be utilized.

The transition from a region of reduced current density into a region of normal current density must not, as shown in FIG. 1, occur abruptly or through a change in the axial or radial extent of the region, rather it can also be achieved quasi-continuously through a changing of the thickness (in the lengthwise direction of the coil) or the number of additional passive wire windings (as described, by way of example, by L. Cesnak and D. Kabat in Journal of Physics E: Scientific Instruments 944, 1972). These can but must not be the same cross section as the superconducting wire, or can also exhibit a rectangular shape.

What is claimed is:

1. Superconducting high field magnetic coil for the production of a homogeneous strong magnetic field, the coil comprising at least one approximately rotationally symmetric hollow cylindrically shaped winding section having a plurality of winding layers of a superconductable wire interconnected in order that current flows only in series therethrough and wherein radial components of the magnetic field are present in an axial end region of said at least one winding section, causing axial Lorentz forces as well as an accumulation of axial pressure in the winding layers, said plurality of winding layers each have at least two regions of differing average winding layer cross sectional surface current density, with both normal current density and reduced current density, and in the vicinity of a coil middle, a region of reduced current density extending over a plurality of winding layers in order to homogenize the magnetic field within a homogenizing volume near a coil center, the plurality of winding layers being interconnected in order that, in operation of the magnetic coil, a reduction in both axial end regions of at least one winding section of the current density in each of a plurality of winding layers relative to a current density in regions of the normal current density bordering the end regions, and maximum axial pressures, acting on the wire, due to Lorentz forces in the plurality of winding layers are held within allowable limits, said winding sections being configured so that in the end regions the current density is reduced by increasing separation between neighboring windings of the superconducting wire through the addition of passive wire windings.

2. Superconducting high field magnetic coil for the production of a homogeneous strong magnetic field, the coil comprising at least one approximately rotationally symmetric hollow cylindrically shaped winding section having a plurality of winding layers of a superconductable wire interconnected in order that current flows only in series therethrough and wherein radial components of the magnetic field are present in an axial end region of said at least one winding section, causing axial Lorentz forces as well as an accumulation of axial pressure in the winding layers, said plurality of winding layers each have at least two regions of differing average winding layer cross sectional surface current density, with both normal current density and reduced current density, and in the vicinity of a coil middle, a region of reduced current density extending over a plurality of winding layers in order to homogenize the magnetic field within a homogenizing volume near a coil center, the plurality of winding layers being interconnected in order that, in operation of the magnetic coil, a reduction in both axial end regions of at least one winding section of the current density in each of a plurality of winding layers relative to a current density in regions of the normal current density bordering the end regions, and maximum axial pressures, acting on the wire, due to Lorentz forces in the plurality of winding layers are held within allowable limits, said winding sections being configured so that in the both axial end regions of at least one winding section, the current density in that winding layer with the region of reduced current density serving for the homogenization is reduced to that in the normal current density of the region bordering on the end region, and that, in remaining winding layers of the axial end region, a transition to the normal current density is effected.

3. Superconducting high field magnetic coil for the production of a homogeneous strong magnetic field, the coil comprising at least one approximately rotationally symmetric hollow cylindrically shaped winding section having a plurality of winding layers of a superconductable wire interconnected in order that current flows only in series therethrough and wherein radial components of the magnetic field are present in an axial end region of said at least one winding section, causing axial Lorentz forces as well as an accumulation of axial pressure in the winding layers, said plurality of winding layers each have at least two regions of differing average winding layer cross sectional surface current density, with both normal current density and reduced current density, and in the vicinity of a coil middle, a region of reduced current density extending over a plurality of winding layers in order to homogenize the magnetic field within a homogenizing volume near a coil center, the plurality of winding layers being interconnected in order that, in operation of the magnetic coil, a reduction in both axial end regions of at least one winding section of the current density in each of a plurality of winding layers relative to a current density in regions of the normal current density bordering the end regions, and maximum axial pressures, acting on the wire, due to Lorentz forces in the plurality of winding layers are held within allowable limits, said winding sections being configured so that in the end regions, the current density is reduced by using rectangular wire having a width to height relationship larger than the width to height relationship of rectangular wire in the region of normal current density.

* * * * *